(12) United States Patent
Boon

(10) Patent No.: US 9,921,404 B1
(45) Date of Patent: Mar. 20, 2018

(54) HEAT TRANSFER FROM LIQUID OR VAPOR FOR FLUOROPOLYMER REFLOW

(71) Applicant: Amazon Technologies, Inc., Seattle, WA (US)

(72) Inventor: Gerben Boon, Ottersum (NL)

(73) Assignee: Amazon Technologies, Inc., Seattle, WA (US)

( * ) Notice: Subject to any disclaimer, the term of this patent is extended or adjusted under 35 U.S.C. 154(b) by 804 days.

(21) Appl. No.: 14/315,134

(22) Filed: Jun. 25, 2014

(51) Int. Cl.
*H05B 33/10* (2006.01)
*G02B 26/00* (2006.01)
*H05K 13/00* (2006.01)

(52) U.S. Cl.
CPC ......... *G02B 26/005* (2013.01); *G02B 26/004* (2013.01); *H05K 13/00* (2013.01)

(58) Field of Classification Search
CPC .... H05K 13/00; G02B 26/004; G02B 26/005; G09G 3/348
USPC ............................................ 216/4, 5, 13, 20
See application file for complete search history.

(56) References Cited

U.S. PATENT DOCUMENTS

| 2013/0057941 A1* | 3/2013 | Massard | G02B 26/005 |
| | | | 359/290 |
| 2013/0242371 A1* | 9/2013 | Kodaira | G02F 1/167 |
| | | | 359/290 |
| 2014/0268298 A1* | 9/2014 | Hendriks | G02B 26/005 |
| | | | 359/290 |
| 2014/0287150 A1* | 9/2014 | Miljkovic | C23C 16/4414 |
| | | | 427/458 |

FOREIGN PATENT DOCUMENTS

WO       WO 2013079709 A1 *   6/2013  ........... G02B 26/005

\* cited by examiner

*Primary Examiner* — Binh X Tran
(74) *Attorney, Agent, or Firm* — EIP US LLP

(57) ABSTRACT

A method for fabricating electronic displays comprises placing a fluoropolymer layer on a support plate for the electronic display device and etching the fluoropolymer layer. Etching changes a surface of the fluoropolymer layer so that the fluoropolymer layer becomes less hydrophobic. Pixel walls are formed on the hydrophilic surface of the fluoropolymer layer to form an array of electrowetting display elements. The fluoropolymer layer is subsequently immersed in a vapor or a liquid that is heated to heat the surface of the fluoropolymer layer. Such immersion allows the surface of the fluoropolymer layer to reflow and to become more hydrophobic.

20 Claims, 6 Drawing Sheets

HEAT TRANSFER FROM LIQUID OR VAPOR FOR FLUOROPOLYMER REFLOW

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display can affect a user's experience with the electronic device and the content presented thereon. Accordingly, finding ways to enhance user experience and satisfaction continues to be a priority. Moreover, increased multimedia use imposes high demands on designs, packaging, and fabricating display devices, as content available for mobile use becomes more extensive and device portability continues to be a high priority.

Electronic displays, such as electrowetting displays, include an array of pixels individually bordered by pixel walls that retain a fluid such as opaque oil, for example. Light transmission through each pixel is adjustable by electronically controlling a position of the fluid in the pixel. A process of fabricating an electrowetting display includes a number of steps, a number of which can involve improvements that lead to lower fabricating costs and higher yields. For example, pixel walls of an electrowetting display may be built upon an amorphous fluoropolymer, which is normally hydrophobic. Adhesion between the pixel walls and the amorphous fluoropolymer may be improved by using processes to alter properties of the amorphous fluoropolymer so that the hydrophobicity of the amorphous fluoropolymer is temporarily changed and subsequently restored after building the pixel walls. Such a process of efficiently restoring the original hydrophobicity of the amorphous fluoropolymer presents a number of challenges.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
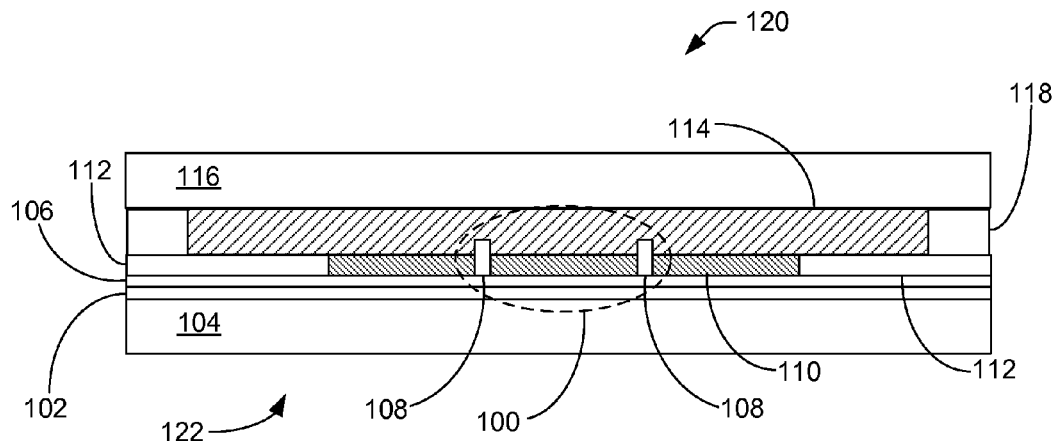
FIG. 1 illustrates a cross-section of a portion of an electrowetting display device, according to some embodiments.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like. Various embodiments described herein include techniques for assembling electronic devices including these components for the electrowetting displays and other features described herein.

A display device, such as an electrowetting display device, can be a transmissive, reflective or transflective display that generally includes an array of display elements (e.g., pixels or subpixels) configured to be operated by an active matrix addressing scheme. For example, rows and columns of electrowetting elements are operated by controlling voltage levels on a plurality of source lines and gate lines. In this fashion, the display device can produce an image by selecting particular display elements to transmit, reflect or block light. Display elements are addressed (e.g., selected) via rows and columns of the source lines and gate lines that are electrically connected to transistors (e.g., used as switches) included in each display element. Transistors take up a relatively small fraction of the area of each display element to allow light to efficiently pass through (or reflect from) the display element. Herein, a display element may, unless otherwise specified, comprise a pixel or subpixel of an electrowetting display device. Such a pixel or subpixel may be the smallest light transmissive, reflective or transflective element of a display that is individually operable to directly control an amount of light transmission or reflection through the element. For example, in some implementations, a display element may be a pixel that includes a red subpixel, a green subpixel, and a blue subpixel. In other implementations, a display element may be a pixel that is a smallest component, e.g., the pixel does not include any subpixels.

Electrowetting displays include an array of display elements comprising pixels and/or subpixels sandwiched between two support plates, such as a substrate and a top plate. For example, the substrate may be a support plate that, in cooperation with the top plate, contains display elements that include electrowetting oil, electrolyte solution and pixel walls between the support plates. Support plates may include glass, plastic (e.g., a transparent thermoplastic such as PMMA or other acrylic), or other transparent material and may be made of a rigid or flexible material, for example.

Display elements include various layers of materials built upon a bottom support plate. One such layer is an amorphous fluoropolymer (AF) upon which pixel walls are built. AF is normally hydrophobic. A process of building pixel walls, however, is improved by altering properties of the AF so that the AF is made to be temporarily hydrophilic during the process of building the pixel walls, which may comprise a photoresist material. After such a process, it is desirable to reinstate the hydrophobic properties of the AF, which is performed by subjecting the AF to environmental conditions that allow the AF to reflow which, among other things, is a process where AF molecules reorganize and redistribute among themselves. Embodiments described herein include various techniques for performing such reflow.

For example, in some embodiments, a method for fabricating electrowetting displays comprises placing an AF layer on a support plate and reactive ion etching (RIE) the AF layer. RIE changes a surface of the AF layer from being hydrophobic to being somewhat hydrophilic (e.g., less hydrophobic). Pixel walls are formed on the less-hydrophobic surface of the AF layer to form an array of electrowetting display elements. The AF layer is subsequently immersed in a vapor or a liquid that is heated to heat the surface of the AF layer. Such immersion allows heat to transfer from the vapor or liquid to the AF layer so that the surface of the AF layer can heat to a glass-transition temperature and reflow to consequently change from being hydrophilic to being hydrophobic.

Heating an AF layer for reflow by liquid or vapor immersion can provide a number of benefits as compared to heating an AF layer by baking in air or gas. For example, one benefit is that contact with a liquid or vapor during immersion in the liquid or gas allows a process of removing impurities from the AF layer and its surface by dissolving the impurities in condensate or by bonding the impurities to the condensate. In this fashion, the liquid or vapor provides a mechanism for transporting the impurities from the AF layer. For example, the liquid or vapor may bond (e.g., via molecular or electrostatic attraction) to such impurities. Subsequently, as the liquid or condensed vapor flows away from the AF layer, the bonded impurities are carried away with the flow. On the other hand, heating the AF layer by baking in air or gas would not provide such a way to remove impurities from the AF layer. As another example benefit, surface energy balance between pixel walls, AF layer, and the immersion liquid or vapor is different from the case where pixel walls and the AF layer are in air or gas.

Pixel walls retain at least a first fluid which is electrically non-conductive, such as opaque or colored oil, in the individual pixels. A cavity formed between the support plates is filled with the first fluid (e.g., retained by pixel walls) and a second fluid (e.g., considered an electrolyte solution) which is electrically conductive or polar and may be water or a salt solution such as a solution of potassium chloride water. The second fluid may be transparent, but may be colored, or absorbing. The second fluid is immiscible with the first fluid.

In addition to display elements, spacers and edge seals can also be located between two clear support plates. Support plates can comprise any of a number of amorphous materials, such as plastic, glass, quartz, semiconductors, and so on, and claimed subject matter is not limited in this respect. Support plates may be transparent. Herein, describing an element or material as being "transparent" means that the element or material can transmit a relatively large fraction of the light incident upon it. For example, a transparent substrate or layer may transmit more than 70% or 80% of the light impinging on its surface, though claimed subject matter is not limited in this respect.

Spacers and edge seals which mechanically connect a first support plate with a second overlying support plate, or which form a separation between the first support plate and the second support plate, contribute to mechanical integrity of the electrowetting display. Edge seals, for example, being disposed along a periphery of an array of electrowetting display device elements, may contribute to retaining (e.g., first and second) fluids between the first support plate and the second overlying support plate. Spacers are desirably transparent so as to not hinder throughput of light in the electrowetting display. Transparency of spacers can at least partially depend on the refractive index of the spacer material, which should be similar to or the same as the refractive indices of surrounding media. Spacers are also desirably chemically inert to surrounding media.

In some embodiments, a display device as described herein can comprise a portion of a system that includes one or more processors and one or more computer memories, which may reside on a control board, for example. Display software can be stored on the one or more memories and can be operable with the one or more processors to modulate light that is received from an outside source (e.g., ambient room light) or out-coupled from a light guide of the display device. For example, display software can include code executable by a processor to modulate optical properties of individual pixels of the electrowetting display based, at least in part, on electronic signals representative of image or video data. The code can cause the processor to modulate the optical properties of pixels by controlling electrical signals (e.g., voltages, currents, fields, and so on) on, over, or in layers of the electrowetting display.

FIG. 1 is a cross-section of a portion of an electrowetting display device illustrating several electrowetting elements 100, according to some embodiments. Though three such electrowetting elements are illustrated, an electrowetting display device can include any number (usually a very large number, such as thousands or millions) of electrowetting elements. An electrode layer 102 is formed on a substrate 104.

In various embodiments, electrode layer 102 may be connected with any number of thin film transistors (TFTs) that are switched to either select or deselect electrowetting elements using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other transparent or non-transparent materials, for example.

In some implementations, a dielectric barrier layer (not illustrated) may at least partially separate electrode layer 102 from an AF layer 106 also formed on substrate 104. Such separation can, among other things, prevent electrolysis occurring through AF layer 106. In some implementations, AF layer 106 can comprise any of a number of types of amorphous fluoropolymers, such as AF1600, produced by DuPont, based in Wilmington, Del. AF layer 106 can also be any of a number of water-repelling materials that affect wettability of an adjacent material, for example. Pixel walls 108 form a patterned electrowetting element grid on AF layer 106. Pixel walls 108 may comprise a photoresist material, such as epoxy-based negative photoresist SU-8. The patterned electrowetting element grid comprises rows and columns that form an array of electrowetting elements. For example, an electrowetting element can have a width and length in a range of about 50 to 500 microns.

A first fluid 110, which can have a thickness (e.g., depth) in a range of about 1 to 10 microns, for example, overlies AF layer 106. First fluid 110 is partitioned by pixel walls 108 of the patterned electrowetting element grid. An outer rim 112 can comprise the same material as pixel walls 108. A second fluid 114, such as an electrolyte solution, overlies first fluid 110 and pixel walls 108 of the patterned electrowetting element grid. An electrolyte solution can be electrically conductive and/or polar. For example, an electrolyte solution may be, among other things, water or a salt solution such as potassium chloride water. First fluid 110 is immiscible with second fluid 114.

A support plate 116 covers second fluid 114 and edge seals 118 maintain second fluid 114 over the electrowetting element array. Support plate 116 may be supported by edge seals 118 and spacers (not illustrated) that extend up to support plate 116 and are interspersed throughout the array of display elements 100. The substrate and the support plate may be made of glass or polymer and may be rigid or flexible, for example. In some implementations, TFTs are fabricated onto support plate 116.

A voltage V applied across, among other things, second fluid 114 and AF layer 106 of individual electrowetting elements can control transmittance or reflectance of the individual electrowetting elements.

The electrowetting display device has a viewing side 120 on which an image formed by the electrowetting display device can be viewed, and a rear side 122. Support plate 116 faces viewing side 120 and substrate 104 faces rear side 122. In an alternative embodiment, the electrowetting display device may be viewed from rear side 122. The electrowetting display device may be a reflective, transmissive or transflective type. The electrowetting display device may be a segmented display type in which the image is built up of segments. The segments can be switched simultaneously or separately. Each segment includes one electrowetting element 100 or a number of electrowetting elements 100 that may be neighboring or distant from one another. Electrowetting elements 100 included in one segment are switched simultaneously, for example. The electrowetting display device may also be an active matrix driven display type or a passive matrix driven display, just to name a few examples.

As mentioned above, second fluid 114 is immiscible with first fluid 110. Herein, substances are immiscible with one another if the substances do not substantially form a solution. Second fluid 114 is electrically conductive and/or polar, and may be water or a salt solution such as a solution of potassium chloride in a mixture of water and ethyl alcohol, for example. Second fluid 114 is preferably transparent, but may be colored or absorbing. First fluid 110 is electrically non-conductive and may for instance be an alkane like hexadecane or (silicone) oil. AF layer 106 is arranged on substrate 104 to create an electrowetting surface area. The hydrophobic character causes first fluid 110 to adhere preferentially to substrate 104 since first fluid 110 has a higher wettability with respect to the surface of AF layer 106 than second fluid 114. Wettability relates to the relative affinity of a fluid for the surface of a solid. Wettability increases with increasing affinity, and it can be measured by the contact angle formed between the fluid and the solid and measured internal to the fluid of interest. For example, such a contact angle can increase from relative non-wettability of more than 90° to complete wettability at 0°, in which case the fluid tends to form a film on the surface of the solid.

First fluid 110 absorbs at least a part of the optical spectrum. First fluid 110 may be transmissive for a part of the optical spectrum, forming a color filter. For this purpose, the fluid may be colored by addition of pigment particles or dye, for example. Alternatively, first fluid 110 may be black (e.g., absorbing substantially all parts of the optical spectrum) or reflective. Hydrophobic layer 106 may be transparent or reflective. A reflective layer may reflect the entire visible spectrum, making the layer appear white, or part of it, making it have a color.

When a voltage is applied across electrowetting element 100, electrowetting element 100 will enter into an active state. Electrostatic forces will move second fluid 114 toward electrode layer 102, thereby displacing first fluid 110 from the area of AF layer 106 to pixel walls 108 surrounding the area of AF layer 106, to a droplet-like form. This action uncovers first fluid 110 from the surface of AF layer 106 of electrowetting element 100. When the voltage across electrowetting element 100 is returned to an in-active signal level of zero or a value near to zero, electrowetting element 100 will return to an inactive state, where first fluid 110 flows back to cover AF layer 106. In this way, first fluid 110 forms an electrically controllable optical switch in each electrowetting element 100. Of course, such details of an electrowetting display device are merely examples, and claimed subject matter is not limited in this respect.

Figure 2:
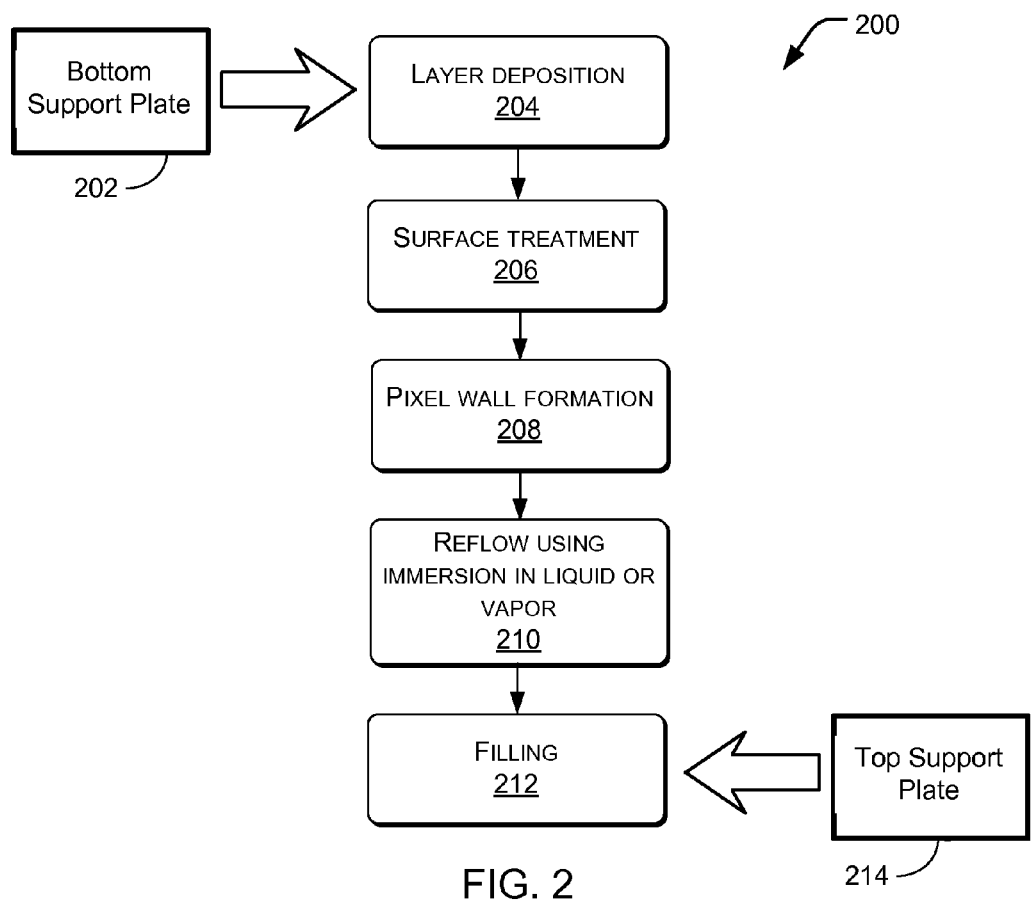
FIG. 2 is a flow diagram of a process for fabricating an electrowetting display, according to some embodiments.

FIG. 2 is a flow diagram of a process 200 for fabricating an electrowetting display, such as electrowetting display illustrated in FIG. 1, according to various embodiments. Process 200 can begin with layer deposition on a bottom support plate 202, which can comprise a transparent glass or plastic material coated with indium-tin-oxide (ITO), for example. A barrier layer and an AF layer are formed at block 204. Surface treatment block 206 is used to modify the originally-hydrophobic AF layer to reduce its hydrophobicity so that a photoresist layer can adhere to the AF layer. Subsequent to the surface treatment, photoresist can be deposited (e.g., by spin coating) on the AF layer in a pixel wall formation block 208 that produces pixel walls and an outer rim that surrounds the pixels of the electrowetting display area. A masking pattern is used to form pixel walls from the photoresist layer.

Subsequent to forming pixel walls and the outer rim, a thermal reflow block 210 re-establishes the hydrophobic nature of the AF layer and cross-links the pixel wall material. Thermal reflow involves heating the AF layer to at least approximately a glass-transition temperature of the AF layer, which may be in a range of about 175 to about 250 degrees centigrade. The AF layer is maintained at the glass-transition temperature for a time sufficient to allow molecules of the AF layer to redistribute and smooth the surface of the AF layer. In some embodiments, reflow is performed by immersing the AF layer in a liquid or a vapor to heat the AF layer to a reflow temperature of the AF layer.

Filling block 212 involves filling pixel recesses (e.g., formed by pixel walls) with oil, covering the oil and the pixel walls with an electrolyte solution, and placing a top support plate 214 to cover the structure and encapsulate the oil and electrolyte solution. Seals are formed along a perimeter of the pixels of the electrowetting display area. In particular, the seals are formed on the outer rim that surrounds the pixels or are formed in recessed regions of the top support plate corresponding to border pixels of the bottom support plate.

Figure 3:
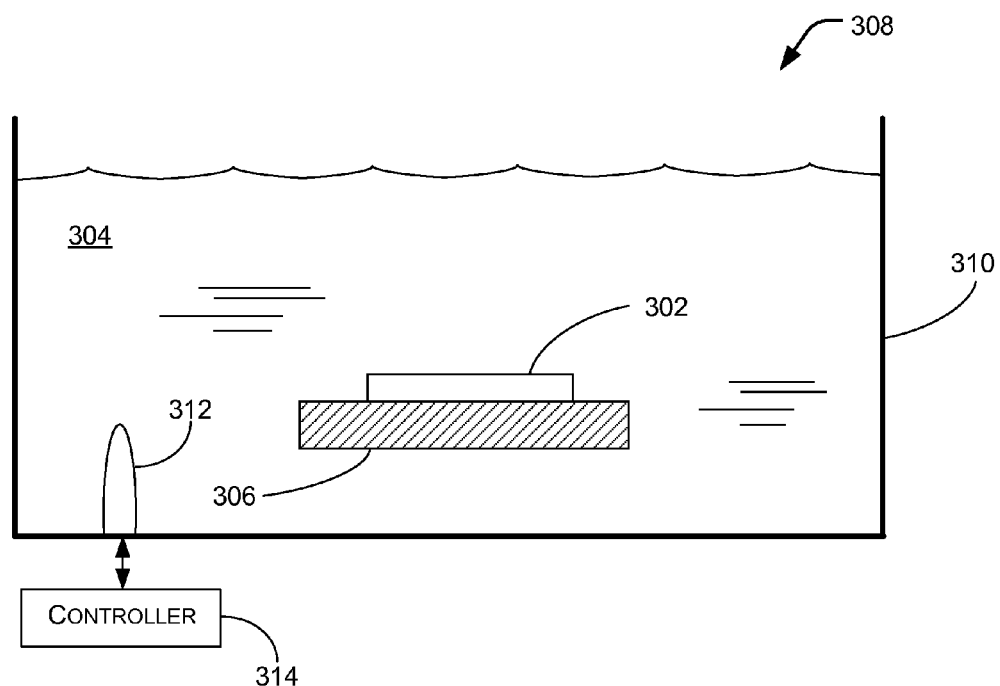
FIG. 3 illustrates a side view of a substrate immersed in a bath of heat transfer liquid, according to some embodiments.

FIG. 3 illustrates a side view of a substrate 302 immersed in a bath of heat transfer liquid 304, according to some embodiments. Substrate 302, being similar to or the same as substrate 104 illustrated in FIG. 1, may be a portion of an electrowetting display device. Substrate 302 may be supported or held by a platform 306 that can be raised from and lowered into heat transfer liquid 304, for example. Platform 306 may be part of an apparatus 308 for fabricating an electrowetting display device. Apparatus 308 may include heat transfer liquid 304, a container 310 to contain heat transfer liquid 304, and a heating element 312 to raise the temperature of heat transfer liquid 304.

Substrate 302 includes an AF layer that has been reactive ion etched for example, so that the AF layer is less hydrophobic. There are a variety of techniques to reduce the hydrophobicity of the AF layer. Such techniques include solvent reflow, application of high voltage, just to name a few examples. Pixel walls are formed on the surface of the less-hydrophobic AF layer. As described above, subsequent to formation of the pixel walls, it is desirable to return the AF layer to its original hydrophobic state. Heating the AF layer to a glass-transition temperature allows the surface of the AF layer to reflow, which will return the AF layer to a hydrophobic state. Immersing substrate 302 in heat transfer liquid 304 provides a technique for heating the AF layer by transferring heat from heat transfer liquid 304 to the AF layer.

Heating element 312 may be operated electronically by a controller 314 configured to maintain the surface of the AF layer at a particular temperature or a particular temperature range while the surface of the AF layer changes from being less hydrophobic (hydrophilic) to being hydrophobic. In a first implementation, controller 314 may comprise, for example, a thermostat that includes a feedback loop that measures temperature of heat transfer liquid 304. In a second implementation, controller 314 may include a timer that determines, based at least in part on temperature of heat transfer liquid 304, when reflow of the AF is complete.

In some embodiments, heat transfer liquid 304 may comprise for example a decane, silicon oil, or other liquid having a boiling point higher than the glass-transition temperature of the AF layer and that does not chemically react with, or dissolve the AF layer. Other examples include undecane, dodecane, tetradecane, squalene, non-polar liquids, non-polar hydrocarbons, and a variety of polar liquids.

Reflow of an AF layer can occur at a glass-transition temperature that may be in the range from about 140 degrees centigrade to about 250 degrees centigrade. In a first implementation, a reflow process may begin when platform 306 and substrate 302 are lowered into heat transfer liquid 304 that is maintained within such a temperature range by heating element 312. Substrate 302, having the AF layer formed thereon, may be held within the bath of heat transfer liquid 304 for several minutes to an hour or more, for example. During this time, heat from the heat transfer liquid 304 transfers to the AF layer to heat the AF layer to the glass-transition temperature so that the AF layer can reflow. In a second implementation, a reflow process may occur while platform 306 and substrate 302 are in heat transfer liquid 304 that is maintained at a temperature close to or at boiling point of the liquid, being above the glass-transition temperature, by heating element 312. Substrate 302, having the AF layer formed thereon, may be held within the vapor for several minutes to an hour or more, for example. During this time, heat is transferred by condensation of vapor formed from heat transfer liquid 304, condensing on the AF layer to heat the AF layer to the glass-transition temperature so that the AF layer can reflow. When reflow is complete, platform 306, substrate 302 and the AF layer formed thereon are raised from the bath of heat transfer liquid 304. As a consequence of such a process, the AF layer is hydrophobic.

Figure 4:
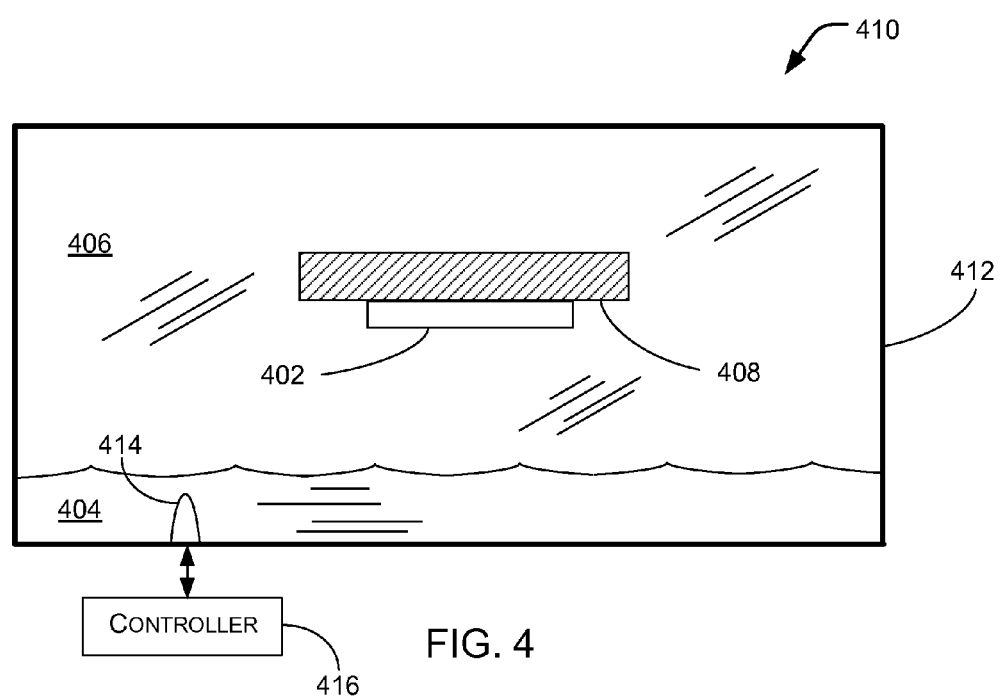
FIG. 4 illustrates a side view of a substrate held over a bath of heat transfer liquid, according to some embodiments.

FIG. 4 illustrates a side view of a substrate 402 above a bath of heat transfer liquid 404 and immersed in a vapor 406 of the heat transfer liquid, according to some embodiments. Substrate 402, being similar to or the same as substrate 104 illustrated in FIG. 1, may be a portion of an electrowetting display device. Substrate 402 may be supported or held by a platform 408 so that substrate 402 is suspended above heat transfer liquid 404 in any orientation such as, for example, tilted to allow heat transfer liquid to flow back into the bath after condensation. Platform 408 may be part of an apparatus 410 for fabricating an electrowetting display device. Apparatus 410 may include heat transfer liquid 404, vapor 406, a container 412 configured as a vapor barrier structure to contain vapor 406 of heat transfer liquid 404, and a heating element 414 to raise the temperature of heat transfer liquid 404. Container 412 may be at least partially sealed to contain vapor 406.

Substrate 402 includes an AF layer that has been reactive ion etched so that the AF layer is less hydrophobic (hydrophilic). Pixel walls are formed on the surface of the hydrophilic AF layer. As described above, subsequent to formation of the pixel walls, it is desirable to return the AF layer to its original hydrophobic state. Heating the AF layer to a glass-transition temperature allows the surface of the AF layer to reflow, which will return the AF layer to a hydrophobic state. Immersing substrate 402 in vapor 406 of heat transfer liquid 404 provides a technique for heating the AF layer by transferring heat from vapor 406 to the AF layer.

Heating element 414 may be operated electronically by a controller 416 configured to maintain the surface of the AF layer at a particular temperature or a particular temperature range while the surface of the AF layer changes from being hydrophilic to being hydrophobic. In a first implementation, controller 416 may comprise, for example, a thermostat that includes a feedback loop that measures temperature of heat transfer liquid 404 and/or vapor 406. In a second implementation, controller 416 may include a timer that determines, based at least in part on temperature of heat transfer liquid 404 and/or vapor 406, when reflow of the AF is complete.

In some embodiments, heat transfer liquid 304 may comprise a decane, silicon oil, or other liquid having a boiling point higher than the glass-transition temperature of the AF layer and that does not chemically react with or dissolve the AF layer. Heat transfer liquid 304 may also comprise undecane, dodecane, tetradecane, squalene, apolar liquids, and non-polar hydrocarbons, just to name a few examples.

Reflow of an AF layer can occur at a glass-transition temperature that may be in the range from about 140 degrees centigrade to about 250 degrees centigrade, though claimed subject matter is not limited in this respect. In a first implementation, a reflow process may occur while platform 408 and substrate 402 are in vapor 406 that is maintained within such a temperature range by heating element 414. Substrate 402, having the AF layer formed thereon, may be held within the vapor for several minutes to an hour or more, for example. During this time, heat from vapor 406 transfers to the AF layer to heat the AF layer to the glass-transition temperature so that the AF layer can reflow. In a second implementation, a reflow process may occur while platform 408 and substrate 402 are in vapor 406 that is maintained at a temperature close to or at boiling point of the liquid, being above the glass-transition temperature, by heating element 414. Substrate 402, having the AF layer formed thereon, may be held within the vapor for several minutes to an hour or more, for example. During this time, heat is transferred by condensation of vapor 406 onto the AF layer to heat the AF layer to the glass-transition temperature so that the AF layer can reflow. Platform 408, substrate 402, and the AF layer formed thereon are removed after a particular time when reflow is complete. When reflow is complete, the AF layer is hydrophobic.

Figure 5:
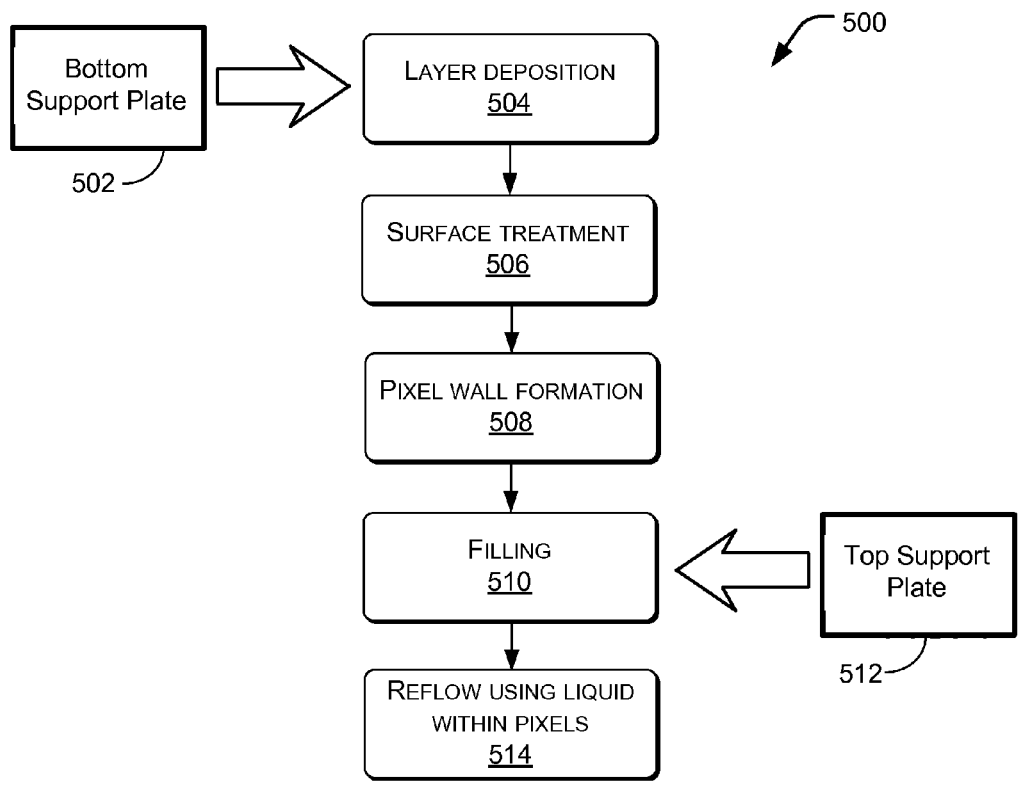
FIG. 5 is a flow diagram of a process for fabricating an electrowetting display, according to some embodiments.

FIG. 5 is a flow diagram of a process 500 for fabricating an electrowetting display, such as electrowetting display illustrated in FIG. 1, according to various embodiments.

Process 500 is similar to portions of process 200 described above, except that reflow occurs after filling in process 500.

Process 500 can begin with layer deposition on a bottom support plate 502, which can comprise a transparent glass or plastic material coated with indium-tin-oxide (ITO), for example. A barrier layer and an AF layer are formed in deposition block 504. Surface treatment block 506 is used to modify the originally-hydrophobic AF layer to be less hydrophobic (hydrophilic) so that a photoresist layer can adhere to the AF layer. Subsequent to the surface treatment, photoresist can be deposited (e.g., by spin coating) on the AF layer in a pixel wall formation block 508 that produces pixel walls and an outer rim that surrounds the pixels of the electrowetting display area. A masking pattern is used to form pixel walls from the photoresist layer.

Filling block 510 involves filling pixel recesses (e.g., formed by pixel walls) with oil, covering the oil and the pixel walls with an electrolyte solution, and placing a top support plate 512 to cover the structure and encapsulate the oil and electrolyte solution. Seals are formed along a perimeter of the pixels of the electrowetting display area. In particular, the seals are formed on the outer rim that surrounds the pixels or are formed in recessed regions of the top support plate corresponding to border pixels of the bottom support plate. The resulting structure, hereinafter called a "display structure", includes the bottom and top support plate and filled pixels.

Subsequent to filling pixel recesses with oil, a thermal reflow block 514 re-establishes the hydrophobic nature of the AF layer and may cross-link the pixel wall material. As described above, thermal reflow involves heating the AF layer to at least approximately a glass-transition temperature of the AF layer. The AF layer is maintained at the glass-transition temperature for a time sufficient to allow molecules of the AF layer to redistribute and smooth the surface of the AF layer. In the present embodiment, reflow is performed by heating the entire display structure resulting from filling block 510.

By heating the entire display structure, heat is transferred to the AF layer from the contacting overlying oil that fills the pixels. In this way, the AF layer can reach a glass-transition temperature and reflow. In some implementations, the oil and overlying electrolyte solution will boil at the glass-transition temperature of the AF layer at atmospheric pressure. Such boiling would generate destructive pressures inside the display structure. Accordingly, the entire display structure is heated in a pressure chamber with a pressure high enough to avoid boiling of the oil and electrolyte solution in the display structure. For example, such a pressure may be greater than one atmosphere.

Figure 6:
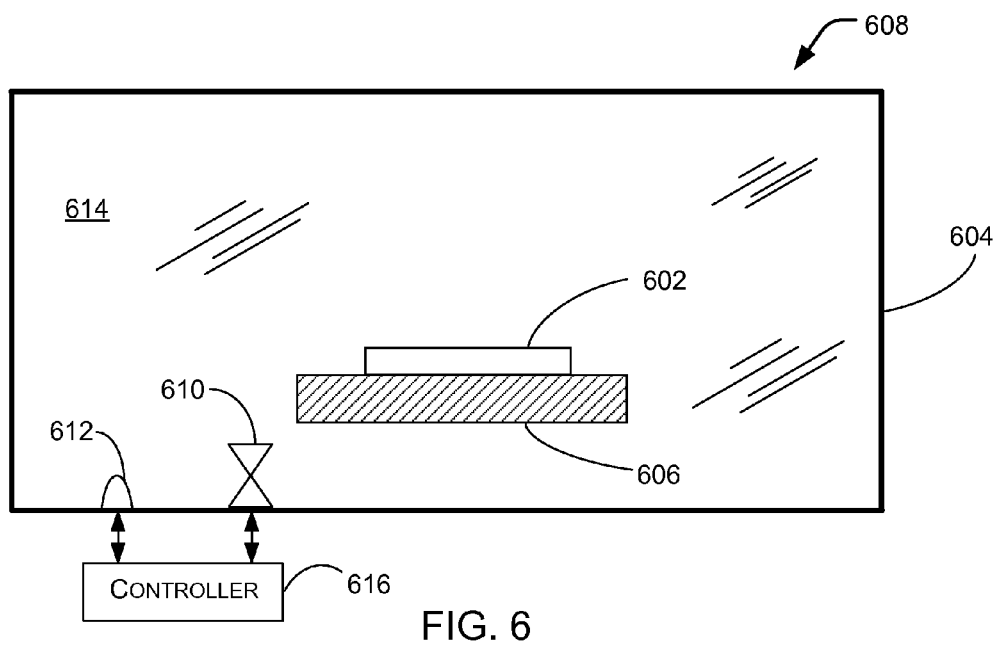
FIG. 6 illustrates a side view of a display structure in a pressure chamber, according to some embodiments.

FIG. 6 illustrates a side view of a display structure 602 in a pressure chamber 604, according to some embodiments. Display structure 602, being similar to or the same as described for process 500, includes bottom and top support plates and pixels filled with oil and electrolyte solution. For example, display structure 602 may be similar to or the same as the electrowetting display device illustrated in FIG. 1. Display structure 602 may be supported or held by a platform 606 that can be moved into and out of pressure chamber 604, for example. Platform 606 may be part of an apparatus 608 for fabricating an electrowetting display device. Apparatus 608 may include pressure chamber 604, a pressure port 610 to raise or lower the pressure in pressure chamber 604, and a heating element 612. Pressure chamber 604 may be filled with air, nitrogen, or other gas 614 or liquid.

Display structure 602 includes an AF layer that has been reactive ion etched for example, so that the AF layer is less hydrophobic (hydrophilic). Pixel walls, which are filled with oil, are formed on the surface of the hydrophilic AF layer. The oil, overlying the AF layer, is in contact with the AF layer. An electrolyte solution covers the oil and the pixel walls. As described above, subsequent to formation of the pixel walls, it is desirable to return the AF layer to its original hydrophobic state. Heating the AF layer to a glass-transition temperature allows the surface of the AF layer to reflow, which will return the AF layer to a hydrophobic state. Heating the entire display structure 602 provides a technique for heating the AF layer by transferring heat from the oil in the pixels to the AF layer.

Pressure port 610 and heating element 612 may be operated by a controller 616 configured to maintain gas 612 in pressure chamber 604 substantially above atmospheric pressure and at an elevated temperature while the surface of the AF layer reflows and changes from being hydrophilic to being hydrophobic. In a first implementation, controller 616 may comprise, for example, one or more transducers that include a feedback loop that measures temperature and pressure of gas 614. In a second implementation, controller 616 may include a timer that determines, based at least in part on temperature and/or pressure of gas 614, when reflow of the AF layer is complete.

Figure 7:
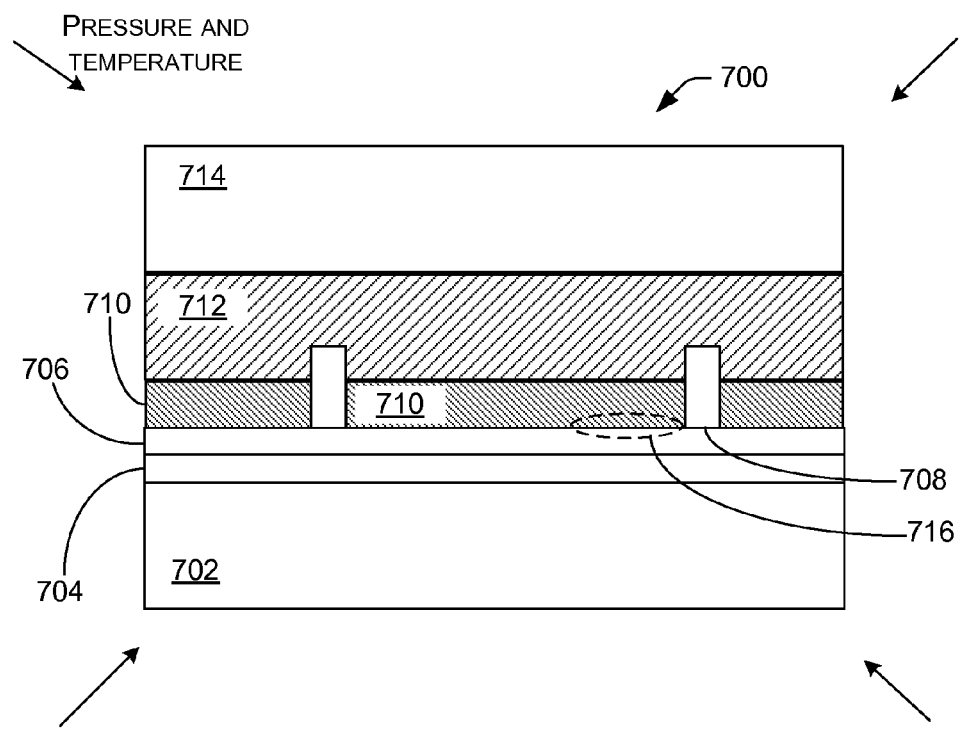
FIG. 7 illustrates a cross-section of a portion of an electrowetting display device, according to some embodiments.

FIG. 7 illustrates a cross-section of a portion 700 of an electrowetting display device, according to some embodiments. Portion 700 is the same as or similar to that illustrated in FIG. 1. Portion 700 includes a bottom plate 702, electrode layer 704, AF layer 706, pixel walls 708, first fluid 710, second fluid 712, and top plate 714. Portion 700 is subjected to increased temperature and pressure, as indicated by diagonal arrows in the figure. For example, portion 700 of the electrowetting display device may be located in an apparatus such as 608, described above, that includes a pressure chamber. Accordingly, first fluid 710 may be at an elevated temperature so that heat transfers from first fluid 710 to AF layer 706, since they are in contact with one another at an interface 716. A temperature of AF layer 706 subsequently rises so that a reflow process of the AF layer occurs. After the reflow process, AF layer 706 is hydrophobic.

Figure 8:
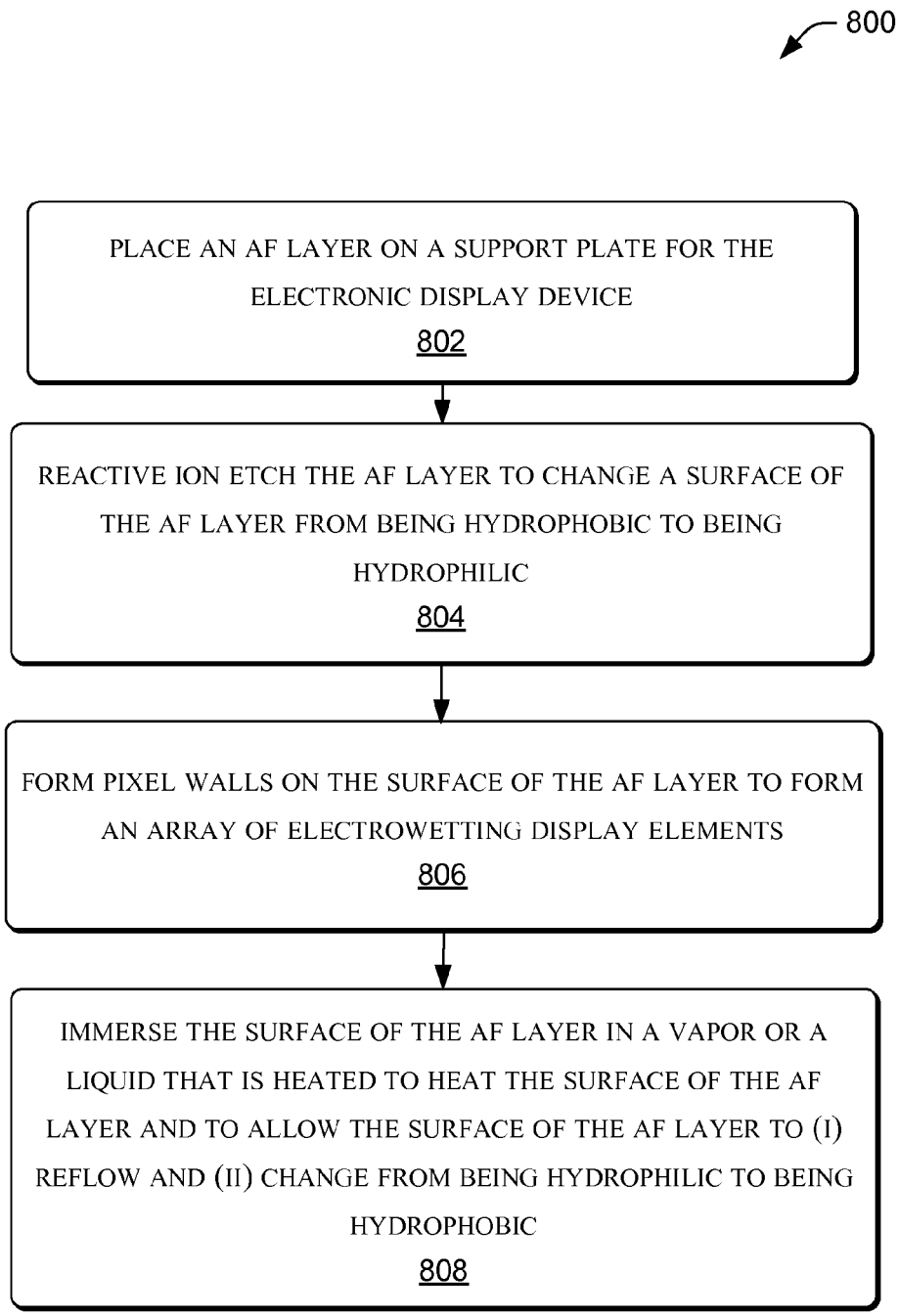
FIG. 8 is a flow diagram of a process for fabricating an electrowetting display device, according to various example embodiments.

FIG. 8 is a flow diagram of a process 800 for fabricating an electrowetting display device, according to various embodiments. For example, the display device may be the same as or similar to the display device illustrated in FIG. 1. Though claimed subject matter is not limited in this respect, process 800 may be performed by, among others, apparatuses 308, 410, and 604, illustrated in FIGS. 3, 4, and 6, respectively. At block 802, an AF layer, such as 106 illustrated in FIG. 1, is placed on a support plate, such as 104, for the electronic display device. At block 804, the AF layer is reactive ion etched, among other processes, to change a surface of the AF layer from being hydrophobic to being less hydrophobic (hydrophilic). At block 806, pixel walls are formed on the surface of the AF layer to form an array of electrowetting display elements, such as 100. At block 808, the surface of the AF layer is immersed in a vapor or a liquid that is heated to heat the surface of the AF layer and to allow the surface of the AF layer to (i) reflow and (ii) change from being hydrophilic to being hydrophobic.

Figure 9:
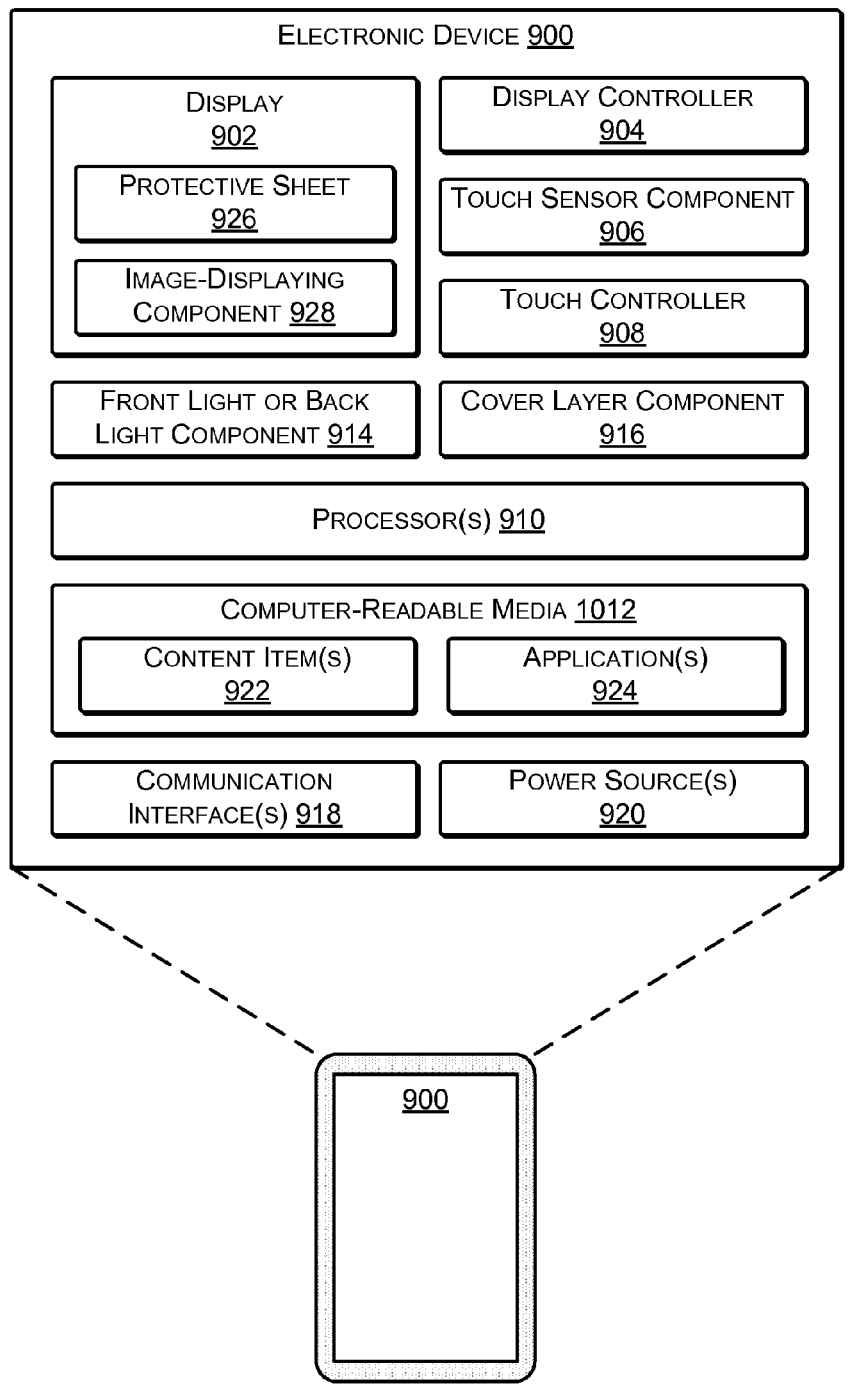
FIG. 9 illustrates an example electronic device that may incorporate a display device, according to some embodiments.

FIG. 9 illustrates an example electronic device 900 that may incorporate any of the display devices discussed above. The device 900 may comprise any type of electronic device having a display. For instance, the device 900 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 900 may be a non-mobile electronic device (e.g., a computer display, a television, etc.). In addition, while FIG. 9 illustrates several example components of the electronic device 900, it is to be appreciated that the device 900 may also include other conventional components, such as an operating system, system busses, input/output components, and the like. Further, in other examples, such as in the case of a television or computer monitor, the electronic device 900 may only include a subset of the components illustrated.

Regardless of the specific implementation of the electronic device 900, the device 900 includes a display 902 and a corresponding display controller 904. The display 902 may represent a reflective or transmissive display in some instances, such as an electronic paper display, a reflective or transmissive LCD display, or the like. Electronic paper displays represent an array of display technologies that largely mimic the look of ordinary ink on paper. In contrast to conventional backlit displays, electronic paper displays typically reflect light, much as ordinary paper does. In addition, electronic paper displays are often bi-stable, meaning that these displays are capable of holding text or other rendered images even when very little or no power is supplied to the display. Some examples of the display 902 that may be used with the implementations described herein include bi-stable LCD displays, micro electromechanical system (MEMS) displays, such as interferometric modulator displays, cholesteric displays, electrophoretic displays, electrofluidic pixel displays, electrowetting displays, photonic ink displays, gyricon displays, and the like. In other implementations, or for other types of devices 900, the display 902 may be an active display such as a fluid crystal display, a plasma display, a light emitting diode display, an organic light emitting diode display, and so forth. Accordingly, implementations herein are not limited to any particular display technology.

In an implementation, the display comprises an electrowetting display that employs an applied voltage to change the surface tension of a fluid in relation to a surface. For example, such an electrowetting display may include the array of pixels 90 illustrated in FIG. 1, though claimed subject matter is not limited in this respect. By applying a voltage to a hydrophobic surface, the wetting properties of the surface can be modified so that the surface becomes increasingly hydrophilic. As one example of an electrowetting display, the modification of the surface tension acts as an optical switch by contracting a colored oil film when a voltage is applied to individual pixels of the display. When the voltage is absent, the colored oil forms a continuous film within a pixel, and the color may thus be visible to a user of the display. On the other hand, when the voltage is applied to the pixel, the colored oil is displaced and the pixel becomes transparent. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content.

Of course, while several different examples have been given, it is to be appreciated that the reflective displays described herein may comprise any other type of electronic paper technology or reflective-display technology, examples of which are provided above. In addition, while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 902 may represent a backlit display, examples of which are mentioned above.

In addition to including the display 902, FIG. 9 illustrates that some examples of the device 900 may include a touch sensor component 906 and a touch controller 908. In some instances, at least one touch sensor component 906 resides with, or is stacked on, the display 902 to form a touch-sensitive display (e.g., an electronic paper touch-sensitive display). Thus, the display 902 may be capable of both accepting user touch input and rendering content in response to or corresponding to the touch input. As several examples, the touch sensor component 906 may comprise a capacitive touch sensor, a force sensitive resistance (FSR), an interpolating force sensitive resistance (IFSR) sensor, or any other type of touch sensor. In some instances, the touch sensor component 906 is capable of detecting touches as well as determining an amount of pressure or force of these touches.

FIG. 9 further illustrates that the electronic device 900 may include one or more processors 910 and one or more computer-readable media 912, as well as a front light component 914 (which may alternatively be a backlight component in the case of a backlit display) for lighting the display 902, a cover layer component 916, such as a cover glass or cover sheet, one or more communication interfaces 918 and one or more power sources 920. The communication interfaces 918 may support both wired and wireless connection to various networks, such as cellular networks, radio, WiFi networks, short range networks (e.g., Bluetooth®), infrared (IR), and so forth.

Depending on the configuration of the electronic device 900, the computer-readable media 912 (and other computer-readable media described throughout) is an example of computer storage media and may include volatile and non-volatile memory. Thus, the computer-readable media 912 may include, but is not limited to, RAM, ROM, EEPROM, flash memory, or other memory technology, or any other medium that can be used to store computer-readable instructions, programs, applications, media items, and/or data which can be accessed by the electronic device 900.

The computer-readable media 912 may be used to store any number of functional components that are executable on the processor 910, as well as content items 922 and applications 924. Thus, the computer-readable media 912 may include an operating system and a storage database to store one or more content items 922, such as eBooks, audio books, songs, videos, still images, and the like. The computer-readable media 912 of the electronic device 900 may also store one or more content presentation applications to render content items on the device 900. These content presentation applications may be implemented as various applications 924 depending upon the content items 922. For instance, the content presentation application may be an electronic book reader application for rending textual electronic books, an audio player for playing audio books or songs, a video player for playing video, and so forth.

In some instances, the electronic device 900 may couple to a cover (not illustrated in FIG. 9) to protect the display (and other components in the display stack or display assembly) of the device 900. In one example, the cover may include a back flap that covers a back portion of the device 900 and a front flap that covers the display 902 and the other components in the stack. The device 900 and/or the cover may include a sensor (e.g., a Hall effect sensor) to detect when the cover is open (i.e., when the front flap is not atop the display and other components). The sensor may send a signal to the front light component 914 when the cover is open and, in response, the front light component 914 may illuminate the display 902. When the cover is closed, meanwhile, the front light component 914 may receive a signal indicating that the cover has closed and, in response, the front light component 914 may turn off.

Furthermore, the amount of light emitted by the front light component 914 may vary. For instance, upon a user opening the cover, the light from the front light may gradually increase to its full illumination. In some instances, the device 900 includes an ambient light sensor (not illustrated in FIG. 9) and the amount of illumination of the front light component 914 may be based at least in part on the amount of ambient light detected by the ambient light sensor. For example, the front light component 914 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 902 may vary depending on whether the front light component 914 is on or off, or based on the amount of light provided by the front light component 914. For instance, the electronic device 900 may implement a larger default font or a greater contrast when the light is off compared to when the light is on. In some instances, the electronic device 900 maintains, when the light is on, a contrast ratio for the display that is within a certain defined percentage of the contrast ratio when the light is off.

As described above, the touch sensor component 906 may comprise a capacitive touch sensor that resides atop the display 902. In some examples, the touch sensor component 906 may be formed on or integrated with the cover layer component 916. In other examples, the touch sensor component 906 may be a separate component in the stack of the display assembly. The front light component 914 may reside atop or below the touch sensor component 906. In some instances, either the touch sensor component 906 or the front light component 914 is coupled to a top surface of a protective sheet 926 of the display 902. As one example, the front light component 914 may include a lightguide sheet and a light source (not illustrated in FIG. 9). The lightguide sheet may comprise a substrate (e.g., a transparent thermoplastic such as PMMA or other acrylic), a layer of lacquer and multiple grating elements formed in the layer of lacquer that function to propagate light from the light source towards the display 902, thus illuminating the display 902.

The cover layer component 916 may include a transparent substrate or sheet having an outer layer that functions to reduce at least one of glare or reflection of ambient light incident on the electronic device 900. In some instances, the cover layer component 916 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, the protective sheet 926 may include a similar UV-cured hard coating on the outer surface. The cover layer component 916 may couple to another component or to the protective sheet 926 of the display 902. The cover layer component 916 may, in some instances, also include a UV filter, a UV-absorbing dye, or the like, for protecting components lower in the stack from UV light incident on the electronic device 900. In still other examples, the cover layer component 916 may include a sheet of high-strength glass having an antiglare and/or antireflective coating.

The display 902 includes the protective sheet 926 overlying an image-displaying component 928. For example, the display 902 may be preassembled to have the protective sheet 926 as an outer surface on the upper or image-viewing side of the display 902. Accordingly, the protective sheet 926 may be integral with and may overlie the image-displaying component 928. The protective sheet 926 may be optically transparent to enable a user to view, through the protective sheet 926, an image presented on the image-displaying component 928 of the display 902.

In some examples, the protective sheet 926 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 926 may include a coating, such as the hard coating described above. For instance, the hard coating may be applied to the outer surface of the protective sheet 926 before or after assembly of the protective sheet 926 with the image-displaying component 928 of the display 902. In some examples, the hard coating may include a photoinitiator or other reactive species in its composition, such as for curing the hard coating on the protective sheet 926. Furthermore, in some examples, the protective sheet 926 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 926, thereby protecting the image-displaying component 928 from UV light.

According to some implementations herein, one or more of the components discussed above may be coupled to the display 902 using fluid optically-clear adhesive (LOCA). For example, suppose that the light guide portion of the front light component 914 is to be coupled to the display 902. The light guide may be coupled to the display 902 by placing the LOCA on the outer or upper surface of the protective sheet 926. When the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 914 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 914. In other implementations, the LOCA may be placed near a center of the protective sheet 926, and pressed outwards towards a perimeter of the top surface of the protective sheet 926 by placing the front light component 914 on top of the LOCA. The LOCA may then be cured by directing UV light through the front light component 914. As discussed above, and as discussed additionally below, various techniques, such as surface treatment of the protective sheet, may be used to prevent discoloration of the LOCA and/or the protective sheet 926.

While FIG. 9 illustrates a few example components, the electronic device 900 may have additional features or functionality. For example, the device 900 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within the device 900 may reside remotely from the device 900 in some implementations. In these implementations, the device 900 may utilize the communication interfaces 918 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, apparatuses, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. A method for fabricating an electrowetting display device, the method comprising:
    placing a fluoropolymer layer on a substrate, the fluoropolymer layer having a first hydrophobicity;
    etching the fluoropolymer layer to decrease a hydrophobicity of the fluoropolymer layer from the first hydrophobicity to a second hydrophobicity;
    forming rows and columns of pixel walls on the fluoropolymer layer to form an array of electrowetting display elements;
    immersing the fluoropolymer layer in a liquid that does not chemically react with the fluoropolymer layer or dissolve the fluoropolymer layer; and
    heating the liquid to a particular temperature to reflow the fluoropolymer layer to produce a reflowed fluoropolymer layer, wherein the reflowed fluoropolymer layer has a third hydrophobicity greater than the second hydrophobicity.

2. The method of claim 1, wherein the liquid comprises an oil that at least partially covers the fluoropolymer layer, the method further comprising:
    at least partially covering the oil with an electrolyte solution;
    forming a seal material that at least partially surrounds the array of electrowetting display elements; and
    placing a top support plate over the oil, the electrolyte solution, and the seal material to form a region including the oil and the electrolyte solution, wherein the region is enclosed by the top support plate, the substrate, and the seal material.

3. The method of claim 1, wherein the particular temperature is less than a boiling point of the liquid.

4. The method of claim 1, wherein the liquid comprises a decane or silicon oil.

5. A method for fabricating an electrowetting display device, the method comprising:
    treating a fluoropolymer layer to reduce a hydrophobicity of the fluoropolymer layer from a first hydrophobicity to a second hydrophobicity;
    heating a liquid to a particular temperature, wherein the liquid does not chemically react with the fluoropolymer layer or dissolve the fluoropolymer layer; and
    heating the fluoropolymer layer by transferring heat from the liquid to the fluoropolymer layer to increase the hydrophobicity of the fluoropolymer layer from the second hydrophobicity to a third hydrophobicity.

6. The method of claim 5, wherein transferring heat from the liquid to the fluoropolymer layer comprises:
    placing the fluoropolymer layer into the liquid.

7. The method of claim 5, wherein transferring heat from the liquid to the fluoropolymer layer comprises:
    heating the liquid to generate a vapor;
    placing the fluoropolymer layer in the vapor; and
    exposing the fluoropolymer layer to the vapor such that the vapor condenses to the liquid on the fluoropolymer layer.

8. The method of claim 7, further comprising removing impurities from the fluoropolymer layer by dissolving the impurities in the vapor afer the vapor has condensed to the liquid on the fluoropolymer layer.

9. The method of claim 7, wherein, during the exposing, the fluoropolymer layer is exposed to the vapor for at least two minutes.

10. The method of claim 5, further comprising forming pixel walls on a surface of the fluoropolymer layer while the fluoropolymer layer has the second hydrophobicity.

11. The method of claim 10, wherein forming the pixel walls on the surface of the fluoropolymer layer includes forming electrowetting elements, the method further comprising:
at least partially filling the electrowetting elements with the liquid and an electrolyte solution.

12. The method of claim 10, wherein transferring heat from the liquid to the fluoropolymer layer comprises:
placing the liquid among the pixel walls and on the fluoropolymer layer;
covering the liquid and the pixel walls with a substrate to form a display structure;
placing the display structure in a pressurized environment having a pressure greater than one atmosphere; and
heating the display structure to heat the liquid and to transfer the heat from the heated liquid to the fluoropolymer layer.

13. The method of claim 12, wherein the liquid is an oil that is in contact with an electrolyte solution.

14. A method for fabricating an electrowetting display device, the method comprising:
treating a fluoropolymer layer to reduce a hydrophobicity of the fluoropolymer layer from a first hydrophobicity to a second hydrophobicity, wherein the fluoropolymer layer includes one or more impurities;
immersing the fluoropolymer layer in at least one of a liquid or a vapor, wherein the liquid or the vapor does not chemically react with the fluoropolymer layer or dissolve the fluoropolymer layer;
heating the at least one of the liquid or the vapor such that the at least one of the liquid or the vapor transports at least a portion of the one or more impurities away from the fluoropolymer layer.

15. The method of claim 14, further comprising:
heating the fluoropolymer layer by transferring heat from the at least one of the liquid or the vapor to the fluoropolymer layer to increase the hydrophobicity of the fluoropolymer layer from the second hydrophobicity to a third hydrophobicity.

16. The method of claim 14, wherein the at least a portion of the one or more impurities are transported by the at least one of the liquid or the vapor from the fluoropolymer layer by dissolving the at least a portion of the one or more impurities in the liquid or a condensed vapor of the liquid.

17. The method of claim 14, wherein the liquid is an oil that is in contact with an electrolyte solution and the vapor is an oil vapor that is in contact with the electrolyte solution.

18. The method of claim 14, further comprising controlling a pressure of the vapor or a pressure of a gas that is in contact with the liquid.

19. The method of claim 14, further comprising forming pixel walls on a surface of the fluoropolymer layer while the fluoropolymer layer has the second hydrophobicity.

20. The method of claim 19, wherein forming the pixel walls on the surface of the fluoropolymer layer includes forming electrowetting elements, the method further comprising:
at least partially filling the electrowetting elements with an electrolyte solution.

\* \* \* \* \*

UNITED STATES PATENT AND TRADEMARK OFFICE
CERTIFICATE OF CORRECTION

PATENT NO. : 9,921,404 B1
APPLICATION NO. : 14/315134
DATED : March 20, 2018
INVENTOR(S) : Boon Page 1 of 1

It is certified that error appears in the above-identified patent and that said Letters Patent is hereby corrected as shown below:

In the Claims

In Column 17, Line 1, in Claim 8, delete "afer" and insert -- after --, therefor.

Signed and Sealed this
Fourth Day of June, 2019

Andrei Iancu
*Director of the United States Patent and Trademark Office*